United States Patent
Song et al.

(10) Patent No.: US 8,224,267 B2
(45) Date of Patent: Jul. 17, 2012

(54) RADIO FREQUENCY-BASED COMMUNICATION TERMINAL HAVING TWO EXCHANGEABLE TRANSMITTING PATHS

(75) Inventors: Ai-Ning Song, Shanghai (CN); Teng-Huei Chu, Taipei (TW); Chang-Pu Lin, Taipei (TW); Chong Xu, Shanghai (CN); Qi-Jian Hu, Shanghai (CN)

(73) Assignees: Ambit Microsystems (Shanghai) Ltd., Shanghai (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 268 days.

(21) Appl. No.: 12/633,881

(22) Filed: Dec. 9, 2009

(65) Prior Publication Data

US 2011/0070846 A1   Mar. 24, 2011

(30) Foreign Application Priority Data

Sep. 23, 2009 (CN) .................. 2009 2 0311102 U

(51) Int. Cl.
H04B 1/04 (2006.01)
(52) U.S. Cl. ............... 455/114.3; 455/127.1; 455/127.2; 455/127.3; 455/126; 455/128

(58) Field of Classification Search ............... 455/114.3, 455/127.3, 127.1, 127.2, 90.3, 126, 128, 455/42.1, 78; 330/126, 254, 140
See application file for complete search history.

(56) References Cited

U.S. PATENT DOCUMENTS

| | | | |
|---|---|---|---|
| 8,023,995 B2 * | 9/2011 | Kuriyama et al. | 455/553.1 |
| 2004/0018815 A1 * | 1/2004 | Lin et al. | 455/73 |
| 2006/0063494 A1 | 3/2006 | Zhang et al. | |
| 2007/0210866 A1 * | 9/2007 | Sato et al. | 330/126 |
| 2007/0281635 A1 * | 12/2007 | McCallister et al. | 455/126 |
| 2009/0253384 A1 * | 10/2009 | Gorbachov | 455/83 |

* cited by examiner

*Primary Examiner* — Temesgh Ghebretinsae
*Assistant Examiner* — MD Talukder
(74) *Attorney, Agent, or Firm* — Altis Law Group, Inc.

(57) ABSTRACT

A radio frequency (RF)-based communication terminal includes a first switching chip, a second switching chip, a comparison module, a low noise amplifier (LNA), a first filter, a power amplifier (PA), a second filter, and a control module. The comparison module compares the power of a radio signal Rx received from a base station with a pre-stored signal and to output a control signal according to the comparison result. The control module controls conductive modes of the first and the second switching chips according to the control signal. In the first conductive mode, a radio signal Tx is sent out from the PA and the second filter. In the second conductive mode, the radio signal Tx is exchanged to send out from the LNA and first filter.

6 Claims, 1 Drawing Sheet

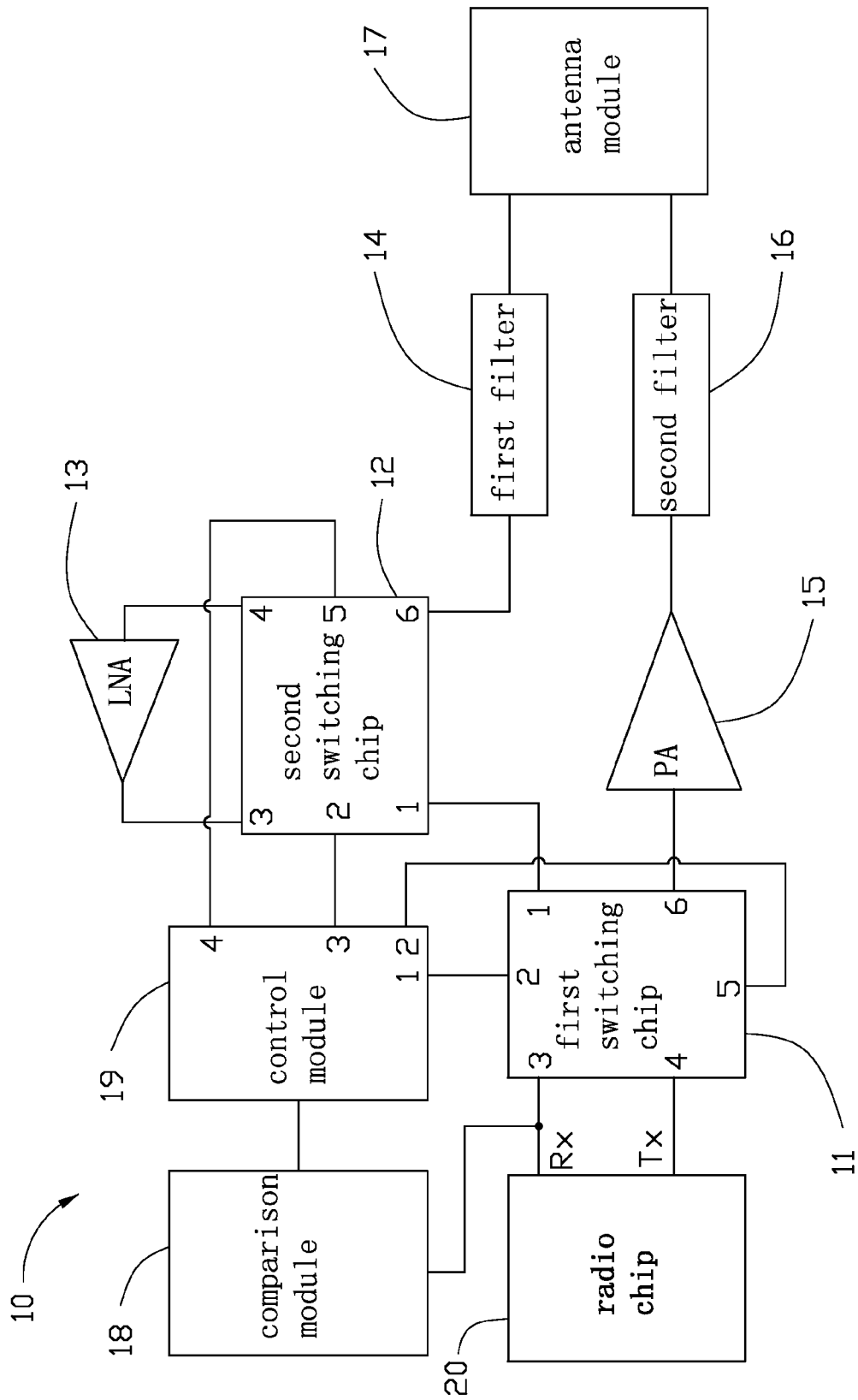

RADIO FREQUENCY-BASED COMMUNICATION TERMINAL HAVING TWO EXCHANGEABLE TRANSMITTING PATHS

BACKGROUND

1. Technical Field

The present disclosure relates to radio frequency (RF)-based communication terminals, and particularly, to an RF-based terminal having two exchangeable transmitting paths.

2. Description of Related Art

In radio frequency (RF)-based communication terminals, radio signals are typically amplified by a power amplifier (PA) before being sent to an antenna to ensure successful transmission of radio signals to the nearest base station. However, such power amplification can waste power when the RF-based communication terminal and the nearest base station are close enough that successful transmission requires only lower power amplification.

Therefore, an RF-based communication terminal which can overcome the above-described problems is desirable.

BRIEF DESCRIPTION OF THE DRAWINGS

Many aspects of the embodiments can be better understood with reference to the following drawing. The components in the drawing are not necessarily drawn to scale, the emphasis instead being placed upon clearly illustrating the principles of the present embodiments.

The FIGURE is a schematic view of an RF-based communication terminal in accordance with an exemplary embodiment.

DETAILED DESCRIPTION

Embodiments of the present RF-based communication terminal will now be described in detail with reference to the FIGURE.

Referring to the FIGURE, an RF-based communication terminal 10, according to an exemplary embodiment, is configured for receiving a radio signal Rx from a base station and transmitting the radio signal Rx to a radio chip 20, and transmitting a radio signal Tx from the radio chip 20 and sending the radio signal Tx to the base station. The radio chip 20 includes an input terminal and an output terminal.

The RF-based communication terminal 10 includes a first switching chip 11, a second switching chip 12, a low noise amplifier (LNA) 13, a first filter 14, a power amplifier (PA) 15, a second filter 16, an antenna module 17, a comparison module 18, and a control module 19.

The first switching chip 11 and the second switching chip 12 are double pole double throw (DPDT) switches with each including a first terminal to a sixth terminal (shown on drawings). When the second terminal receives a low level signal and the fifth terminal receives a high level signal, the first terminal conducts with the fourth terminal, and the third terminal conducts with the sixth terminal. When the second terminal receives a high level signal and the fifth terminal receives a low level signal, the first terminal conducts with the third terminal, and the fourth terminal conducts with the sixth terminal. The third terminal and fourth terminal of the first switching chip 11 respectively connect with the input terminal and output terminal of the radio chip 20. The first terminal of the first switching chip 11 connects with the first terminal of the second switching chip 12.

The LNA 13 is a low power signal amplifier with nominal output power of about several dB, and power consumption thereof is about 100 mW. The LNA 13 includes an input terminal and an output terminal. The input terminal and the output terminal of the LNA 13 connect with the fourth terminal and the third terminal of the second switching chip 12 respectively.

The first filter 14 is a band-pass filter, and includes an input terminal and an output terminal. The output terminal of the first filter 14 connects with the sixth terminal of the second switching chip 12.

The PA 15 is a high power signal amplifier with nominal output power of about several tens of dB, and power consumption thereof is about 300 mW. The PA 15 includes an input terminal and an output terminal. The input terminal of the PA 15 connects with the sixth terminal of the first switching chip 11.

The second filter 16 is a low pass filter, and includes an input terminal and an output terminal. The output terminal of the second filter 16 connects with the output terminal of the PA 15.

The antenna module 17 includes a first access terminal and a second access terminal. The first access terminal of the antenna module 17 connects with the input terminal of the first filter 14. The second access terminal of the antenna module 17 connects with the output terminal of the second filter 16.

The comparison module 18 includes an input terminal and an output terminal. The input terminal of the comparison module 18 connects with the third terminal of the first switching chip 11. The comparison module 18 acquires the power of the radio signal Rx from the third terminal of the first switching chip 11, and compares the power of the radio signal Rx with that of a pre-stored signal and generates a control signal according to the comparison result.

The control module 19 includes an input terminal and first to fourth output terminals. The input terminal of the control module 19 connects with the output terminal of the comparison module 18. The first and the second output terminals of the control module 19 respectively connect with the second terminal and the fifth terminal of the first switching chip 11. The third and the fourth output terminals of the control module 19 respectively connect with the second terminal and the fifth terminal of the second switching chip 12. The control module 19 controls a conductive mode of the first switching chip 11 and the second switching chip 12 according to the control signal output from the comparison module 18.

In use, when the RF-based communication module is not in a vicinity of a base station and radio signals need to be amplified to ensure successful transmission, the first to the fourth output terminals of the control module 19 output at high level, low level, high level, and low level signals respectively. Each of the first and second switching chips 11, 12 is operated in a first conductive mode in which the first terminal conducts to the third terminal and the fourth terminal conducts to the sixth terminal. The antenna module 17 receives a radio signal Rx and directs it to the first filter 14. The radio signal Rx is filtered by the first filter 14 and transmitted to the sixth terminal of the second switching chip 12. The radio signal Rx is transmitted to the LNA 13 from the fourth terminal of the second switching chip 12. The LNA 13 amplifies the radio signal Rx and transmits it to the third terminal of the second switching chip 12. The radio signal Rx is transmitted to the first terminal of the first switching chip 11 from the first terminal of the second switching chip 12. The radio chip 20 receives the radio signal Rx from the third terminal of the second switching chip 12.

Generally, the power of the radio signal Rx is proportional to the distance between the RF-based communication terminal 10 and the nearest base station (not shown). In detail, radio signal power decreases directly proportional to distance. Thus, in this embodiment, the pre-stored signal in the comparison module 18 is configured to determine whether the RF-based communication module 10 is within a desired vicinity of the nearest base station. If the RF-based communication module 10 is within a desired vicinity of the nearest base station, power amplification of radio signal Tx by the PA 15 greater than desired.

Accordingly, the comparison module 18 acquires the power of the radio signal Rx from the third terminal of the first switching chip 11. If the power of the radio signal Rx is lower than that of the pre-stored signal, the comparison module remains makes no changes to the control signal. Accordingly, the control module 19 is kept operating in the first conductive mode. The radio signal Tx output from the radio chip 20 is sent from the fourth terminal to the sixth terminal of the first switching chip 11. The PA 15 amplifies the radio signal Tx and transmits it to the second filter 16. The radio signal Tx is filtered by the second filter 16 and transmitted to the antenna module 17. The antenna module 17 transmits the radio signal Tx to the base station. In this embodiment, the RF-based communication terminal 10 is operating in a half-duplex communication mode.

If the power of the radio signal Rx is greater than that of the pre-stored signal, the first to the fourth terminals of the control module 19 output low level, high level, low level, and high level signals respectively according to the control signal output from comparison module 18. Each of the first and second switching chips 11, 12 is operated in a second conductive mode in which the first terminal conducting to the fourth terminal and the third terminal conducting to the sixth terminal. The radio signal Tx output from the radio chip 20 is sent from the fourth terminal to the first terminal of the first switching chip 11. The first terminal of the second switching chip 12 receives the radio signal Tx and outputs it from the fourth terminal. The radio signal Tx is amplified by the LNA 13 and transmitted to the third terminal of the second switching chip 12. The first filter 14 filters the radio signal Tx output from the sixth terminal of the second switching chip 12 and transmits it to the antenna module 17. The antenna module 17 sends the radio signal Tx to the base station.

After the radio signal Tx is transmitted out from the LNA, the control module 19 returns the first and second switching chips to their initial state.

It will be understood that the above particular embodiments and methods are shown and described by way of illustration only. The principles and the features of the present invention may be employed in various and numerous embodiment thereof without departing from the scope of the invention as claimed. The above-described embodiments illustrate the scope of the invention but do not restrict the scope of the invention.

What is claimed is:

1. A radio frequency (RF)-based communication terminal comprising:

a first switching chip and a second switching chip each comprising a first terminal to a sixth terminal, the first terminal of the first switching chip connected to the first terminal of the second switching chip; wherein each of the first switching chip and the second switching chip works in one of a first conductive mode and a second conductive mode, when each of the first switching chip and the second switching chip works in the first conductive mode where the second terminal receives a low level signal and the fifth terminal receives a high level signal, the first terminal conducts with the fourth terminal and the third terminal conducts with the sixth terminal; when each of the first switching chip and the second switching chip works in the second conductive mode where the second terminal receives a high level signal and the fifth terminal receives a low level signal, the first terminal conducts with the third terminal and the fourth terminal conducts with the sixth terminal;

a low noise amplifier (LNA) comprising an input terminal connected to the fourth terminal of the second switching chip and an output terminal connected to the third terminal of the second switching chip;

a first filter comprising an output terminal connected to the sixth terminal of the second switching chip and an input terminal;

a power amplifier (PA) comprising an input terminal connected to the sixth terminal of the first switching chip and an output terminal;

a second filter comprising an input terminal connected to the output terminal of the PA and an output terminal;

an antenna module connected to the input terminal of the first filter and the output terminal of the second filter;

a comparison module connected with the third terminal of the first switching chip, the comparison module operable to compare the power of a radio signal acquired from the third terminal of the first switching chip with a pre-stored signal and to output a control signal according to the comparison result;

a control module connected with the comparison module, the second terminal and the fifth terminal of each of the first switching chip and the second switching chip, the control module controlling each of the first and second switching chips to work in one of the first conductive mode and the second conductive mode according to the control signal; and a radio chip connected to the third terminal and the fourth terminal of the first switching chip;

wherein in the second conductive mode, the first filter, the sixth terminal and the fourth terminal of the second switching chip, the LNA, the third terminal and the first terminal of the second switching chip, and the first terminal and the third terminal of the first switching chip form a receive path; in the first conductive mode, the fourth terminal and the first terminal of the first switching chip, the first terminal and the fourth terminal of the second switching chip, the LNA, the third terminal and the sixth terminal of the second switching chip, and the first filter form a first transmit path; in the second conductive mode, the fourth terminal and the sixth terminal of the first switching chip, the PA, and the second filter form a second transmit path.

2. The RF-based communication terminal in claim 1, wherein the first and second switching chips are configured for operating with the first terminal conducting to the third terminal and the fourth terminal conducting to the sixth terminal when the power of the radio signal acquired from the third terminal of the first switching chip is lower than the pre-stored signal, and operating with the first terminal conducting to the fourth terminal and the third terminal conducting to the sixth terminal when the power of the radio signal acquired from the third terminal of the first switching chip is greater than the pre-stored signal.

3. The RF-based communication terminal in claim 1, wherein the power consumption of the PA exceeds that of the LNA.

4. The RF-based communication terminal in claim 1, wherein the first filter is a band-pass filter, and the second filter is a low pass filter.

5. The RF-based communication terminal in claim 1, wherein the first and second switching chips are double pole double throw (DPDT) switches.

6. The RF-based communication terminal in claim 2, wherein when the antenna module receives a radio signal, the control module outputs a high level signal to the second terminal of each of the first and second switching chips, and outputs a low level signal to the fifth terminal of each of the first and second switching chips.

* * * * *